United States Patent
Wan et al.

(10) Patent No.: US 11,631,832 B2
(45) Date of Patent: Apr. 18, 2023

(54) ELECTROLUMINESCENT DISPLAY PANEL INCLUDING ORGANIC LAYER FILLED SLOTTED DAMS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Chenxing Wan, Beijing (CN); Wang Ding, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 17/255,849

(22) PCT Filed: Mar. 20, 2020

(86) PCT No.: PCT/CN2020/080378
§ 371 (c)(1),
(2) Date: Dec. 23, 2020

(87) PCT Pub. No.: WO2020/238355
PCT Pub. Date: Dec. 3, 2020

(65) Prior Publication Data
US 2021/0265594 A1  Aug. 26, 2021

(30) Foreign Application Priority Data
May 28, 2019  (CN) .......................... 201910450505.0

(51) Int. Cl.
*H01L 51/00* (2006.01)
*H01L 51/52* (2006.01)
(Continued)

(52) U.S. Cl.
CPC ...... *H01L 51/5253* (2013.01); *H01L 27/3262* (2013.01); *G02F 1/133305* (2013.01);
(Continued)

(58) Field of Classification Search
CPC ............ H01L 51/5253; H01L 51/0097; H01L 2251/301; H01L 27/3262; H01L 27/3258;
(Continued)

(56) References Cited

U.S. PATENT DOCUMENTS 9,634,287 B1 *  4/2017  Shin .................... H01L 51/5253
10,319,308 B2  6/2019  Lee et al.
(Continued)

FOREIGN PATENT DOCUMENTS

CN   106653818 A   5/2017
CN   107731869 A   2/2018
(Continued)

OTHER PUBLICATIONS

First Chinese Office Action dated Jul. 17, 2020 for Chinese Patent Application No. 201910450505.0, 20 pages.

*Primary Examiner* — Ida M Soward
(74) *Attorney, Agent, or Firm* — Kinney & Lange, P.A.

(57) ABSTRACT

An electroluminescent display panel and a display apparatus are provided. The display panel includes: a base substrate including a display region and a non-display region; an encapsulating structure on the base substrate, extending from the display region to the non-display region; and a crack dam structure on the base substrate, locating at an edge of the non-display region and on a side of the encapsulating structure away from the display region. The crack dam structure includes: an inorganic layer on the base substrate, including a plurality of dams and a plurality of slots, the dams and the grooves locating at an edge of a side of the inorganic layer away from the display region; and an organic
(Continued)

layer, on the inorganic layer, covering at least the dams and fill the slots, wherein a surface of the organic layer away from the base substrate includes at least a non-planar structure.

20 Claims, 5 Drawing Sheets

(51) Int. Cl.
*H01L 27/32* (2006.01)
*H01L 29/78* (2006.01)
*H01L 33/22* (2010.01)
*H01L 33/24* (2010.01)
*G02F 1/13* (2006.01)
*G06F 1/16* (2006.01)
*G09F 9/30* (2006.01)
*G02F 1/1333* (2006.01)
*H01L 33/12* (2010.01)
*H01L 29/786* (2006.01)

(52) U.S. Cl.
CPC .......... *G06F 1/1641* (2013.01); *G06F 1/1652* (2013.01); *G09F 9/301* (2013.01); *G09G 2300/0408* (2013.01); *G09G 2300/0804* (2013.01); *H01L 27/3211* (2013.01); *H01L 29/7869* (2013.01); *H01L 29/78693* (2013.01); *H01L 33/12* (2013.01); *H01L 33/22* (2013.01); *H01L 33/24* (2013.01); *H01L 2251/301* (2013.01)

(58) Field of Classification Search
CPC ............ H01L 27/3211; H01L 29/7869; H01L 29/78693; H01L 33/22; H01L 33/24; H01L 33/12; G02F 1/133305; G02F 2001/133357; G06F 1/1641; G06F 1/1652; G09F 9/301; G09G 2300/0408; G09G 2300/0804
See application file for complete search history.

(56) References Cited

U.S. PATENT DOCUMENTS

| | | | |
|---|---|---|---|
| 10,396,310 B2 | 8/2019 | Choi et al. | |
| 10,572,056 B2* | 2/2020 | Gwon | H01L 27/3265 |
| 10,629,845 B2* | 4/2020 | Kim | H01L 51/5253 |
| 10,692,953 B2 | 6/2020 | Yoon et al. | |
| 11,342,532 B2* | 5/2022 | Liu | H01L 51/5253 |
| 2016/0204373 A1* | 7/2016 | Park | H01L 27/3246 |
| | | | 257/40 |
| 2016/0285038 A1* | 9/2016 | Kim | H01L 51/5237 |
| 2016/0336541 A1* | 11/2016 | Kim | H01L 51/5256 |
| 2017/0033312 A1* | 2/2017 | Kim | H01L 51/5253 |
| 2017/0047541 A1 | 2/2017 | Ishii et al. | |
| 2017/0069873 A1* | 3/2017 | Kim | H01L 51/525 |
| 2017/0077456 A1* | 3/2017 | Chung | H01L 27/326 |
| 2018/0006256 A1 | 1/2018 | Tojo | |
| 2018/0047802 A1 | 2/2018 | Yoon et al. | |
| 2018/0102502 A1* | 4/2018 | Kim | H01L 27/3258 |
| 2018/0159077 A1* | 6/2018 | Lee | H01L 51/5253 |
| 2018/0166019 A1* | 6/2018 | Lee | H01L 51/5203 |
| 2018/0226612 A1 | 8/2018 | Choi et al. | |
| 2018/0366520 A1* | 12/2018 | Gwon | H01L 27/3246 |
| 2019/0013374 A1* | 1/2019 | Park | H01L 51/5253 |
| 2019/0214587 A1* | 7/2019 | Kim | G09F 9/301 |
| 2019/0295475 A1 | 9/2019 | Lee et al. | |
| 2019/0312226 A1* | 10/2019 | Huang | H01L 51/5253 |
| 2020/0006461 A1* | 1/2020 | Cho | H01L 27/3246 |
| 2020/0273944 A1 | 8/2020 | Yoon et al. | |
| 2020/0279902 A1* | 9/2020 | Xiong | H01L 51/5253 |
| 2021/0066650 A1 | 3/2021 | Yu et al. | |

FOREIGN PATENT DOCUMENTS

| | | | | |
|---|---|---|---|---|
| CN | 108010921 A | * | 5/2018 | ......... H01L 27/1248 |
| CN | 108231791 A | | 6/2018 | |
| CN | 207719213 U | | 8/2018 | |
| CN | 110120465 A | | 8/2019 | |
| CN | 110400891 A | | 11/2019 | |
| CN | 110416273 A | | 11/2019 | |
| EP | 3333896 A1 | | 6/2018 | |
| EP | 3333896 B1 | | 5/2021 | |
| KR | 20180091987 A | | 8/2018 | |

* cited by examiner

ELECTROLUMINESCENT DISPLAY PANEL INCLUDING ORGANIC LAYER FILLED SLOTTED DAMS

CROSS-REFERENCE TO RELATED APPLICATION

The present application is a Section 371 National Stage Application of International Application No. PCT/CN2020/080378, filed Mar. 20, 2020, entitled "ELECTROLUMINESCENT DISPLAY PANEL AND DISPLAY APPARATUS INCLUDING THE SAME", which claims the benefit of Chinese Patent Application No. 201910450505.0 filed on May 28, 2019 in the National Intellectual Property Administration of China, the disclosure of which is incorporated herein by reference in entirety.

TECHNICAL FIELD

The present disclosure relates to the field of display technologies, especially to an electroluminescent display panel and a display apparatus including the same.

BACKGROUND

In the display industry, OLED display panels have the advantages of clear image quality, practicality of forming flexible products, lightness and thinness, etc. Due to the light and thin design of OLED display panels, requirements of encapsulation effects of OLED display panels are relatively high. However, in the related art, edges of OLED display panels are prone to cracks, especially when the edges of OLED display panel suffer impacts, it is easy for water and oxygen to invade, causing failure of the encapsulation of the OLED display panel, thus the service life of the OLED display panel is shortened.

The above information disclosed in this section is only for understanding the background of the present disclosure, thus, the above information may include information that does not constitute the prior art.

SUMMARY

In one aspect, an electroluminescent display panel is provided, comprising: a base substrate, the base substrate comprising a display region and a non-display region arranged along a periphery of the display region; an encapsulating structure on the base substrate, the encapsulating structure extending from the display region to the non-display region; and a crack dam structure on the base substrate, the crack dam structure being located at an edge of the non-display region, and being located on a side of the encapsulating structure away from the display region, the crack dam structure comprising: an inorganic layer on the base substrate, the inorganic layer comprising a plurality of dams and a plurality of slots, the plurality of dams and the plurality of grooves being located at an edge of a side of the inorganic layer away from the display region; and an organic layer, the organic layer being disposed on the inorganic layer, covering at least the plurality of dams and filling the plurality of slots, wherein a surface of the organic layer away from the base substrate comprises at least a non-planar structure.

According to some exemplary embodiments, the non-planar structure comprises at least one stress groove, and each stress groove is provided with a groove opening away from the base substrate and a groove bottom close to the base substrate.

According to some exemplary embodiments, an orthographic projection of the non-planar structure on the base substrate falls within an orthographic projection of a combination of the plurality of dams and the plurality of slots on the base substrate.

According to some exemplary embodiments, there are a plurality of stress grooves, and the number of the stress grooves is equal to the number of the slots.

According to some exemplary embodiments, orthographic projections of the groove bottoms of the plurality of stress grooves on the base substrate fall within orthographic projections of the plurality of slots on the base substrate, respectively.

According to some exemplary embodiments, a vertical distance between the groove bottom of each stress groove and the base substrate is greater than a vertical distance between a surface of the dam away from the base substrate and the base substrate.

According to some exemplary embodiments, a width of the stress groove in a radial direction decreases gradually or remains unchanged from the groove opening towards the groove bottom, and the radial direction is a direction from a center of the display panel to an edge of the display panel.

According to some exemplary embodiments, the groove bottom of the stress groove comprises a planar surface, a curved surface, or a combination of a planar surface and a curved surface.

According to some exemplary embodiments, structures of the plurality of stress grooves are the same.

According to some exemplary embodiments, the non-planar structure further comprises at least one stress protrusion, and each stress protrusion comprises a convex roof away from the base substrate.

According to some exemplary embodiments, an orthographic projection of the convex roof of the stress protrusion on the base substrate falls within orthographic projections of the plurality of dams on the base substrate.

According to some exemplary embodiments, each stress groove and/or each stress protrusion extends in a peripheral direction of the display panel.

According to some exemplary embodiments, the plurality of dams and the plurality of slots are arranged alternately in the radial direction, and the radial direction is the direction from the center of the display panel to the edge of the display panel.

According to some exemplary embodiments, each slot penetrates the inorganic layer in a direction perpendicular to the base substrate.

According to some exemplary embodiments, the inorganic layer comprises a gate insulating layer and an interlayer dielectric layer.

According to some exemplary embodiments, the organic layer comprises a planarization layer.

In another aspect, a display apparatus is provided, comprising the aforementioned electroluminescent display panel.

BRIEF DESCRIPTION OF THE DRAWINGS

The aforementioned and/or additional aspects and advantages of the present disclosure would become apparent and easily understood from the description to the embodiments with reference to the following drawings, wherein.

DETAILED DESCRIPTION OF EMBODIMENTS

Figure 1:
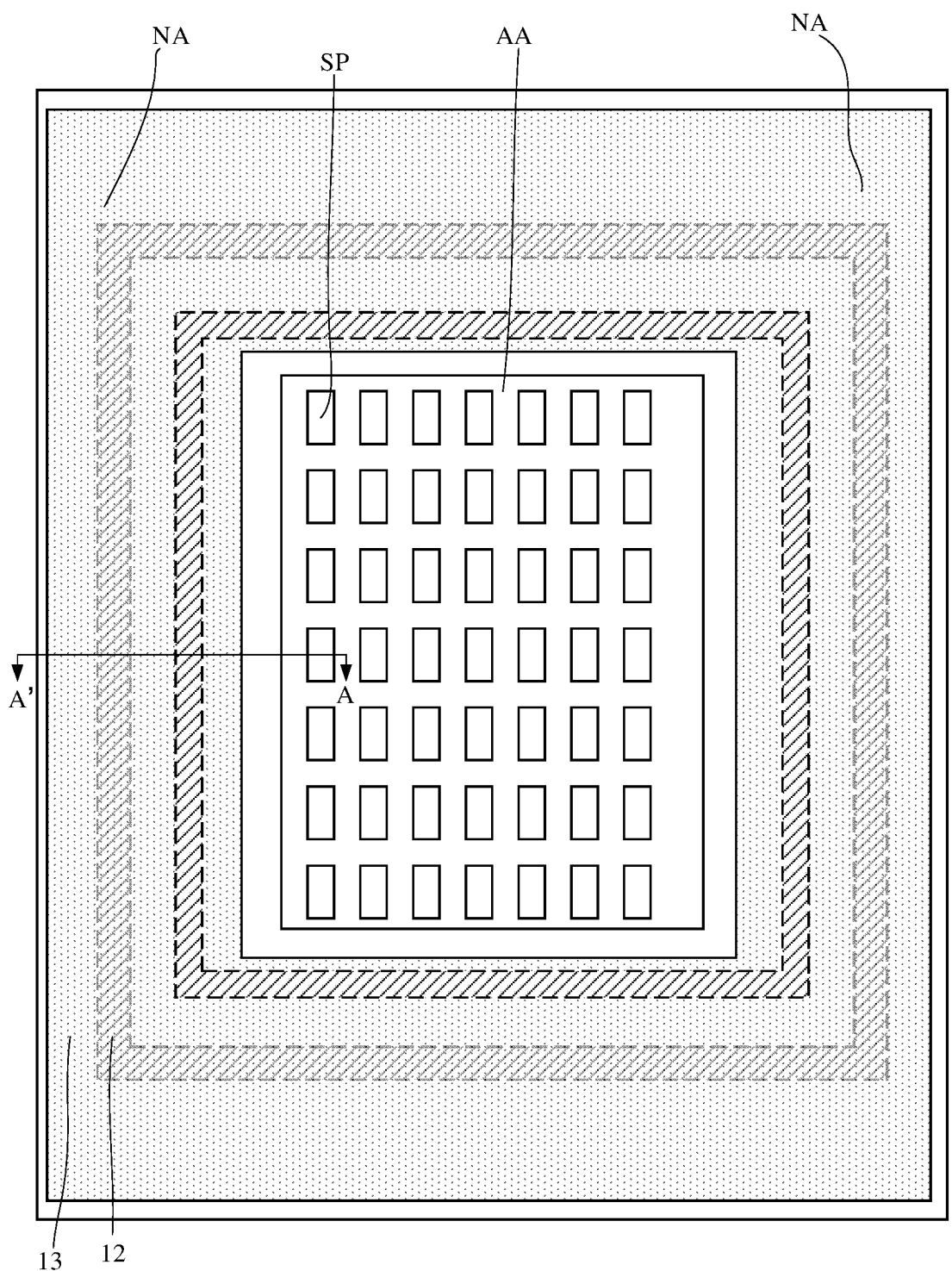
FIG. 1 is a plan view of the OLED display panel according to exemplary embodiments of the present disclosure.

In the following, embodiments of the present disclosure will be described in more details, examples of the embodiments are shown in the drawings, wherein same or similar reference numerals indicate the same or like elements or elements with the same or similar functions throughout the specification. The embodiments described below with reference to the drawings are exemplary, and are only used for explaining the present disclosure, and should not be construed as limiting the present disclosure.

In the description of the present disclosure, it should be understood that, terms "center", "transversal", "length", "width", "up", "down", "left", "right", "top", "bottom", "inner", "outer", and the like indicating an orientation or a positional relationship based on the orientation or position shown in the drawings, and are only for facilitating describing the present disclosure and simplifying the description, rather than indicating or implying that the indicated device or element must have a particular orientation, be configured and operated in particular orientation, thus they should not be construed as limiting the present disclosure.

It should be noted that, in the following exemplary embodiments, the display panel of embodiments of the present disclosure is described by taking the OLED display panel as an example, however, embodiments of the present disclosure are not limited to this, for example, the display panel of the embodiments of the present disclosure may further comprise other types of electroluminescent display panels including QLED (quantum dot light emitting diode) display panel, or the like.

The OLED display panel 100 according to the embodiments of the present disclosure is described below with reference to FIG. 1-FIG. 6.

Figure 2:
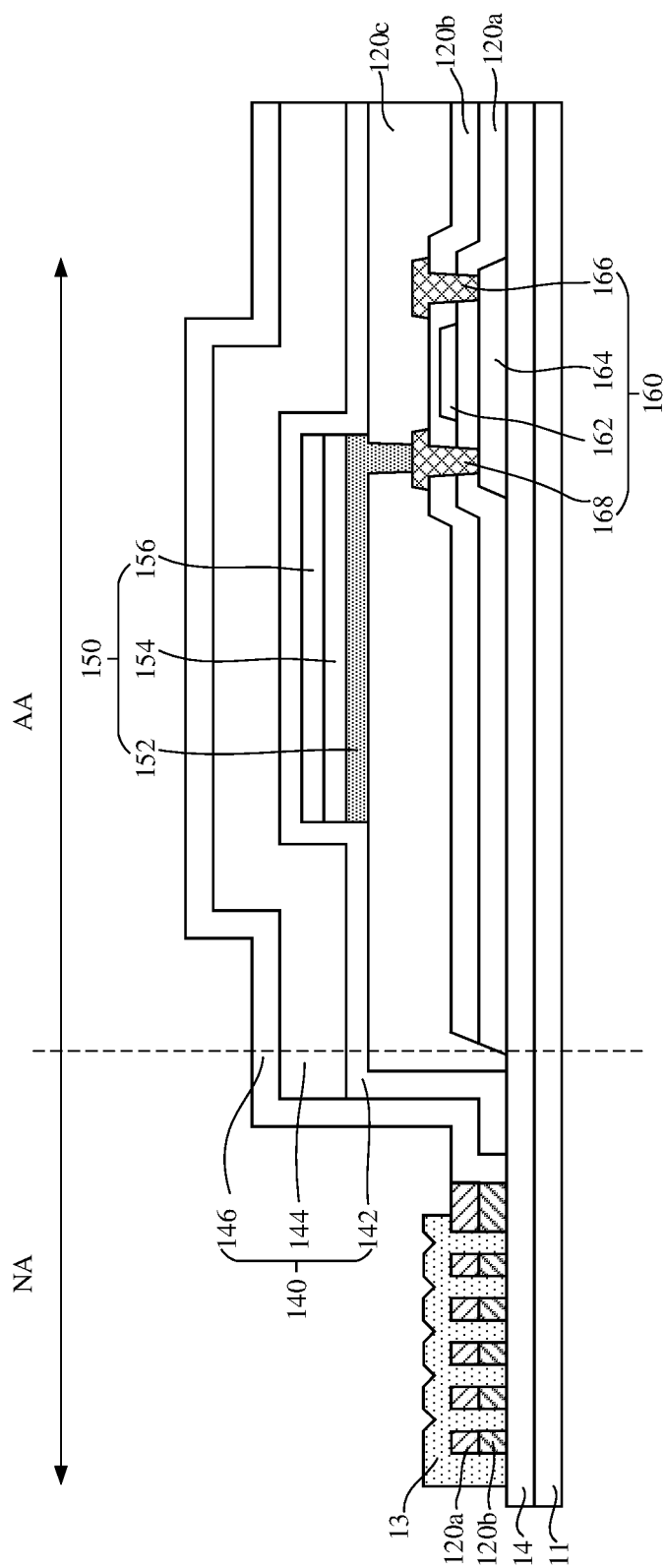
FIG. 2 is a sectional view of the OLED display panel according to the exemplary embodiments of the present disclosure taken along line AA' in FIG. 1.

FIG. 1 is a plan view of the OLED display panel according to the exemplary embodiments of the present disclosure, FIG. 2 is a sectional view of the OLED display panel according to the exemplary embodiments of the present disclosure taken along line AA' in FIG. 1, FIG. 3 to FIG. 6 are sectional views of a crack dam structure of the OLED display panel according to some exemplary embodiments of the present disclosure.

With reference to FIG. 1 and FIG. 2, the OLED display panel 100 may comprise a base substrate 11, and the base substrate 11 comprises a display region (AA region in FIG. 1) and a non-display region (NA region in FIG. 1). The non-display region NA is disposed along a periphery of the display region AA, for example, the non-display region NA may surround the display region AA. For example, the base substrate 11 may be a glass substrate or a plastic substrate, or, the base substrate 11 may be a flexible base substrate composed of polyimide or polycarbonate materials. For example, the base substrate 11 may comprise two first layers and two second layers, the two first layers and the two second layers may be arranged alternately, wherein the first layers may be polyimide layers, and the second layers may be isolation layers so as to isolate water and oxygen. It should be understood that, the specific structure of the base substrate 11 may be set according to actual applications, and is not limited to this.

Optionally, the OLED display panel 100 may further comprise a buffer layer 14 on the base substrate 11, for example, the buffer layer 14 may be a silicon oxide layer or a silicon nitride layer.

Various structures such as pixel driving circuit, organic light emitting element, encapsulating structure and crack dam structure may be disposed on the buffer layer 14, which will be described in detail below with reference to the drawings.

With reference to FIG. 1, the display region AA is provided with pixel units arranged in an array to display images, for example, each pixel unit may comprise red (R) sub-pixel SP, green (G) sub-pixel SP and blue (B) sub-pixel SP, or comprise red (R) sub-pixel SP, green (G) sub-pixel SP, blue (B) sub-pixel SP and white (W) sub-pixel SP.

As shown illustratively in FIG. 2, each of the sub-pixels SP may comprise a pixel driving circuit and a light emitting element 150 connected to the pixel driving circuit. For example, the pixel driving circuit may comprise a plurality of switching transistors, driving transistors and storage capacitors, and the driving transistor 160 is shown illustratively in FIG. 2.

As shown illustratively in FIG. 2, the driving transistor 160 may comprise: a semiconductor layer 164 on the buffer layer 14; a gate electrode 162 overlapped with the semiconductor layer 164, wherein a gate insulating layer (that is, GI layer) 120b is interposed between the gate electrode and the semiconductor layer; and a source electrode 166 and a drain electrode 168, which are formed on an interlayer dielectric layer (that is, ILD layer) 120a and in contact with the semiconductor layer 164. For example, the semiconductor layer 164 may be formed of at least one of amorphous semiconductor materials, polycrystalline semiconductor materials or oxide semiconductor materials.

The OLED display panel 100 may further comprise a planarization layer 120c on a side of the source electrode 166 and the drain electrode 168 away from the base substrate 11.

The organic light emitting element 150 comprises an anode 152 and a cathode 156 disposed opposite to each other, and an organic layer 154 is provided between the anode 152 and the cathode 156. The anode 152 is electrically connected to the drain electrode 168 through a via hole which passes through the planarization layer 120c.

The OLED display panel 100 may further comprise an encapsulating structure 140. With reference to FIG. 2, the encapsulating structure 140 with multiple layers is disposed on the organic light emitting element 150. The encapsulating structure 140 prevents external water and oxygen from invading the organic light emitting element 150 which is prone to be affected by external water and oxygen. As such, the encapsulating structure 140 comprises a plurality of inorganic encapsulating layers 142, 146 and an organic encapsulating layer 144 between the inorganic encapsulating layers 142, 146, and the inorganic encapsulating layer 146 is disposed as the uppermost layer. Here, the encapsulating structure 140 comprises at least two inorganic encapsulating layers 142, 146 and at least one organic encapsulating layer 144. In the present disclosure, the structure of the encapsulating structure 140 will be described illustratively, wherein the organic encapsulating layer 144 is disposed between the first inorganic encapsulating layer 142 and the second inorganic encapsulating layer 146.

It should be understood that, the encapsulating structure 140 extends from the display region AA to the non-display region NA, so that the organic light emitting element 150 in the interior of the OLED display panel may be protected and avoided from invasion of water and oxygen.

The OLED display panel 100 may further comprise a crack dam structure 1. The crack dam structure 1 is located at an outer edge of the display panel 100, that is, the crack dam structure is located at an edge of the non-display region NA and on a side of the encapsulating structure 140 away from the display region AA. It should be noted that, the crack dam structure 1 is not encapsulated by the encapsulating structure 140, as shown in FIG. 3 to FIG. 6.

With reference to FIG. 3 to FIG. 6, the crack dam structure 1 comprises an inorganic layer 12. The inorganic layer 12 is disposed on the base substrate 11 and has a good water and oxygen resisting property, so that water and oxygen may be prevented from intruding into the interior of the OLED display panel which otherwise could lead to the failure of the encapsulation of the OLED display panel 100 and the service life may be shortened, in this way, the reliability of the OLED display panel 100 is further ensured.

A plurality of dams 121 and a plurality of slots 122 are provided at an edge of the inorganic layer 12, that is, the plurality of dams 121 and the plurality of slots 122 are located at an edge on a side of the inorganic layer 12 away from the display region AA. The plurality of dams 121 may be arranged in sequence from the outside to the inside. Each dam 121 may extend along an outer edge of the OLED display panel 100 (for example, extend in a direction perpendicular to the principal plane in FIG. 3 to FIG. 6) so as to form an elongated structure, as shown in FIG. 1. Thus, the exposure of the OLED display panel 100 is ensured, thereby the display effect of the OLED display panel 100 is ensured. For example, the number of the dams is n, $2 \leq n \leq 20$, optionally, n may be 5, 8, or 10, and so on.

It should be noted that, the plan view of the crack dam structure 1 shown in FIG. 1 is merely illustrative, which is used only for illustrating the structure of the crack dam structure 1 in the plan view, wherein the number of the dams and the number of the slots are not intended to limit the embodiments of the present disclosure, and are not intended to correspond to the number shown in other drawings, so as to show various structures of the plan view apparently.

The inorganic layer 12 may comprise an inorganic layer body 123. The inorganic layer body 123 may be located inside of the plurality of dams 121 and the plurality of slots 122. The plurality of dams 121 and the plurality of slots 122 may be arranged alternately from the outside to the inside, one slot 122 may be defined between two adjacent dams 121, and one dam 121 is formed between two adjacent slots 122. A slot 122 may be defined between the innermost one of the plurality of dams 121 and the inorganic layer body 123. For example, a surface on a side of the inorganic layer 12 away from the base substrate 11 may be recessed towards the base substrate 11 to form the slots 122.

It should be note that, the direction "outside" indicates a direction away from the center of the OLED display panel 100, whose opposite direction is defined as "inside". An expression "radial direction" in the present disclosure may indicate a direction from the center of the display panel 100 to the edge of the display panel 100, that is the left-right direction in FIG. 3 to FIG. 6. In the description of the present disclosure, an expression "a plurality of" means equal to or greater than two.

The crack dam structure 1 may further comprise an organic layer 13. The organic layer 13 may be disposed on the inorganic layer 12, and the organic layer 13 covers at least the plurality of dams 121 and fills the plurality of slots 122. The organic layer 13 may cover only the plurality of dams 12, or the organic layer 13 may cover both the plurality of dams 121 and a part of the inorganic layer body 123. The organic layer 13 may be disposed on the edge of the inorganic layer 12. A plurality of protruding portions 133 may be formed on the organic layer 133, and the plurality of protruding portions 133 may fit into the plurality of slots 122 respectively to fill the plurality of slots 122. Thus, the organic layer 13 may absorb and disperse stress well. In this way, when the outer edge of the display panel 100 suffers an impact, for example, when the OLED display panel 100 falls onto the ground, the organic layer 13 may buffer to a certain extent, thereby the stress concentration may be reduced to a certain extent, cracks may be avoided from generating and entering AA region (effective display region). Water and oxygen may be avoided from intruding along the cracks, that is, the generation of water and oxygen intrusion path may be avoided, thus the encapsulating reliability of the OLED is ensured in a certain extent.

The organic layer 13 covers a plurality of dams 121 and fills a plurality of slots 122, it may be understood that from the appearance of the OLED display panel, the plurality of dams 121 and the plurality of slots 122 cannot be seen directly.

As shown in FIG. 3 to FIG. 6, a surface on a side of the organic layer 13 away from the inorganic layer 12 (for example, the upper side in FIG. 3 to FIG. 6) is formed as a non-planar surface, so that a non-planar structure is formed on the side of the organic layer 13 away from the inorganic layer 12. That is to say, the surface of the organic layer 13 away from the base substrate 11 comprises at least a non-planar structure.

Compared with the surface on the side of the organic layer 13 away from the inorganic layer 12 having a planar structure, the non-planar structure in the present disclosure may disperse the stress well when the outer edge of the OLED display panel 100 suffers an impact, thereby further preventing the stress from being too concentrated. In other words, in the embodiments of the present disclosure, the surface on the side of the organic layer 13 away from the inorganic layer 12 is provided with a non-planar structure, thereby the stress of the impact could be dispersed well, the cracks may be effectively prevented from generating, and a transmission of the cracks may be avoided, thus the encapsulating reliability of the OLED display panel 100 may be increased.

It should be noted that, an expression "planar" may indicate that connecting lines of any two points in the plane fall within the plane, and an expression "non-planar" may indicate that connecting lines of at least two points do not fall within the plane.

In the OLED display panel 100 according to the embodiments of the present disclosure, the organic layer 13 is provided, and the surface on the side of the organic layer 13 away from the inorganic layer 12 has the non-planar structure. Further, an orthographic projection of the non-planar structure on the base substrate 11 falls within an orthographic projection of a combination of the plurality of dams 121 and the plurality of slots 122 on the base substrate 11. When the outer edge of the OLED display panel 100 suffers an impact, the organic layer 13 may effectively disperse the stress generated due to the impact, thereby preventing the outer edge of the OLED display panel 100 from generating cracks. In this way, the anti-impact capacity of the OLED display panel 100 is increased, the encapsulating reliability of the OLED display panel 100 is increased, the service life of the OLED display panel 100 is increased, and the performance of the product is improved.

In some optional embodiments of the present disclosure, the surface on the side of the organic layer 13 away from the inorganic layer 12 is provided with at least one stress groove 131, that is, the non-planar structure comprises at least one stress groove 131. The surface of the organic layer 13 away from the base substrate 11 (for example, the upper surface in FIG. 3-FIG. 5) is provided with one stress groove 131 or a plurality of stress grooves 131. A portion of the surface on the side of the organic layer 13 away from the inorganic layer 12 recessed towards the inorganic layer 12 to form the stress groove 131, so that the surface on the side of the organic layer 13 away from the inorganic layer 12 is formed into the non-planar structure, thus the buffer effect of the organic layer 13 is effectively increased. In this way, the organic layer 13 may effectively disperse the stress. It should be noted that, each stress groove 131 may include a groove opening away from the base substrate 11 and a groove bottom close to the base substrate 11.

Specifically, when there is one stress groove, the stress groove 131 may extend along the outer edge of the OLED display panel 100 to form an elongated structure; when there are a plurality of stress grooves 131, the plurality of stress grooves 131 may be arranged in sequence from the outside to the inside, each stress groove 131 may extend along the outer edge of the OLED display panel 100 to form an elongated structure. That is to say, each stress groove 131 may extend in a peripheral direction of the OLED display panel 100, as shown in FIG. 1.

Figure 3:
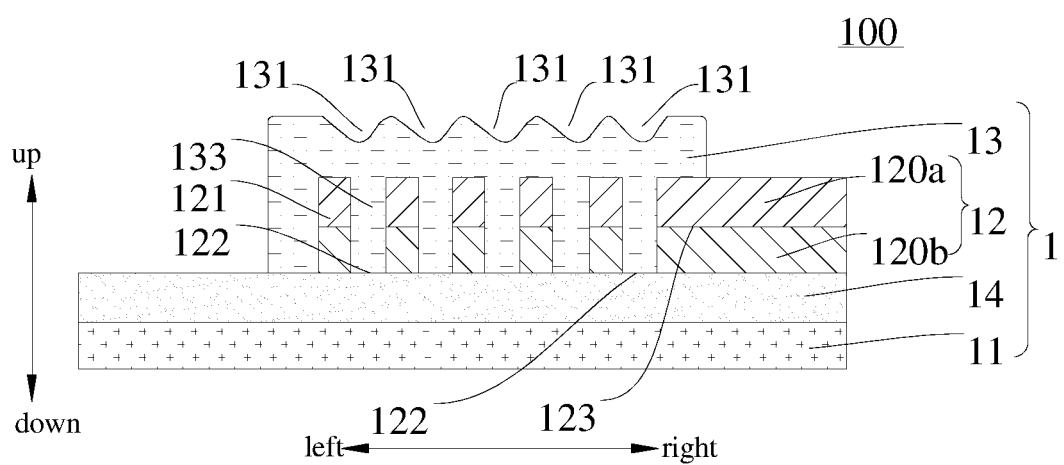
FIG. 3 to FIG. 6 are sectional views of a crack dam structure of the OLED display panel according to some exemplary embodiments of the present disclosure.
Figure 4:
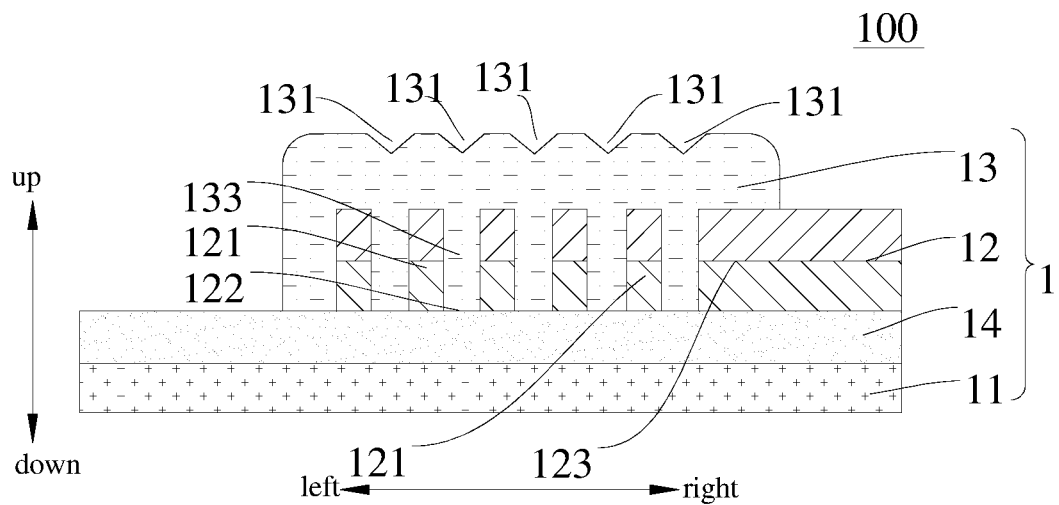
Figure 5:
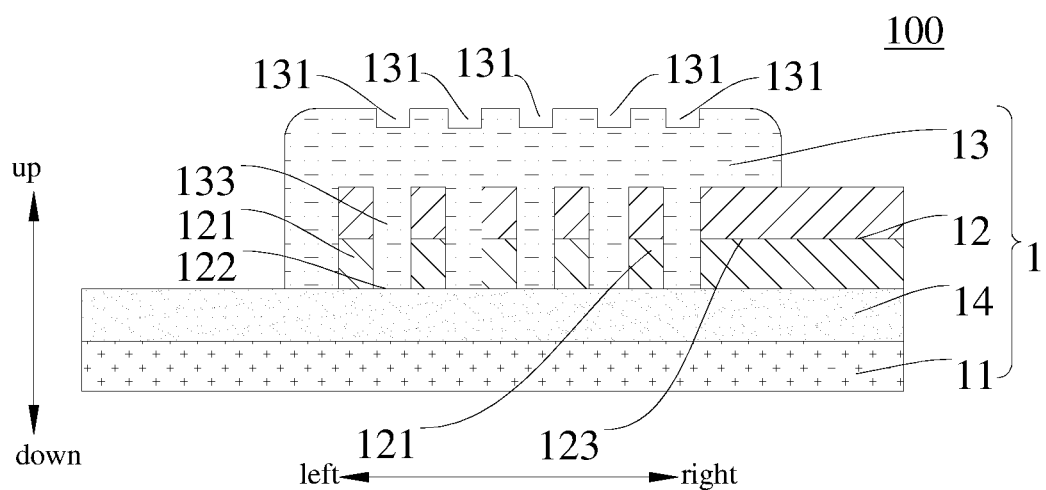

For example, in examples of FIG. 3 to FIG. 5, the number of the stress grooves may be 5. It should be understood that, the number of the stress grooves 131 may be set according to actual applications, and is not limited to this, for example, there may be 4, or 10, or 15, or 20 stress grooves 131.

In some other optional embodiments of the present disclosure, the surface on the side of the organic layer 13 away from the inorganic layer 12 is provided with at least one stress protrusion 132, that is, the non-planar structure further comprises a stress protrusion 132. The surface of the organic layer 13 away from the base substrate 11 (for example, the upper surface in FIG. 6) is provided with one stress protrusion 132 or a plurality of stress protrusions 132. A portion of the surface on the side of the organic layer 13 away from the inorganic layer 12 may protrude in a direction away from the inorganic layer 12 to form the stress protrusion 132. Similarly, the surface on the side of the organic layer 13 away from the inorganic layer 12 may be formed into the non-planar structure as well, thereby ensuring that the organic layer 13 may effectively disperse the stress.

Specifically, when there is one stress protrusion 132, the stress protrusion 132 may extend along the outer edge of the OLED display panel 100 to form an elongated structure; when there are a plurality of stress protrusions 132, and the plurality of stress protrusions 132 may be arranged in sequence from the outside to the inside. Each stress protrusion 132 may extend along the outer edge of the OLED display panel 100 to form an elongated structure. That is to say, each stress protrusion 132 may extend along the periphery of the display panel 100.

Figure 6:
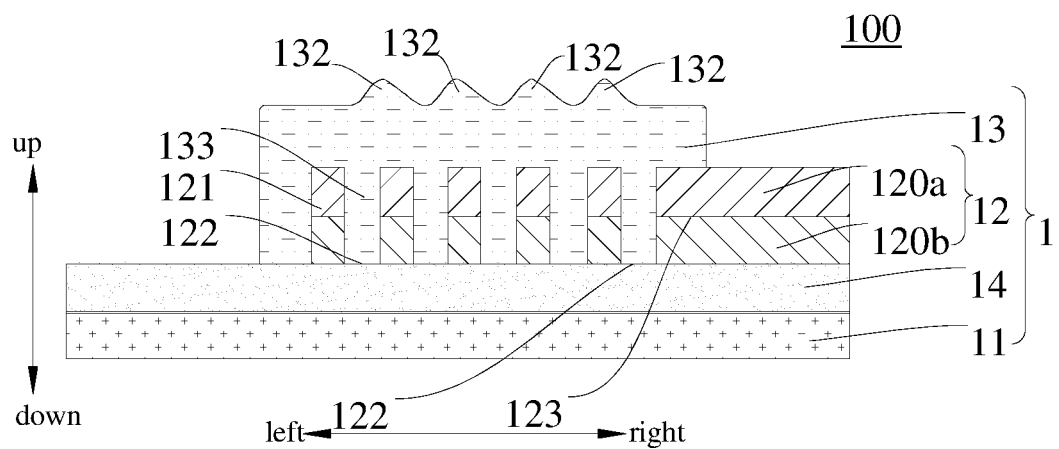

For example, in the example of FIG. 6, there may be 4 stress protrusions. It should be understood that, the number of the stress protrusions may be set according to actual applications, and is not limited to this, for example, there may be 5, or 9, or 17 stress protrusions 132.

In some optional embodiments of the present disclosure, the surface on the side of the organic layer 13 away from the inorganic layer 12 is provided with at least one stress groove 131 and at least one stress protrusion 132, that is, the surface on the side of the organic layer 13 away from the inorganic layer 12 is provided with one stress groove 13 and one stress protrusion 132, or the surface on the side of the organic layer 13 away from the inorganic layer 12 is provided with one stress groove 131 and a plurality of stress protrusions 132, or the surface on the side of the organic layer 13 away from the inorganic layer 12 is provided with a plurality of stress grooves 131 and one stress protrusion 132, or the surface on the side of the organic layer 13 away from the inorganic layer 12 is provide with a plurality of stress grooves 131 and a plurality of stress protrusions 132. In this way, the surface on the side of the organic layer 13 away from the inorganic layer 12 is formed into the non-planar structure, thereby ensuring that the organic layer 13 may effectively disperse the stress.

Specifically, when there is one stress groove 131 and one stress protrusion 132, the stress groove 131 and the stress protrusion 132 may be arranged from the outside to the inside, the stress groove 131 may be located outside or inside of the stress protrusion 132; when there is one stress groove 131 and there are a plurality of stress protrusions 132, the stress groove 131 and the plurality of stress protrusions 132 may be arranged from the outside to the inside, the stress groove 131 may be located outside or inside of the plurality of stress protrusions 132, or the stress groove 131 may be located between the plurality of stress protrusions 132; when there are a plurality of stress grooves 131 and there is one stress protrusion 132, the stress protrusion 132 and the plurality of stress grooves 131 may be arranged from the outside to the inside, the stress protrusion 132 may be located outside or inside of the plurality of stress grooves 131, or the stress protrusion 132 may be located between the plurality of stress grooves 131; when there are a plurality of stress grooves 131 and there are a plurality of stress protrusions 132, the plurality of stress grooves 131 and the plurality of stress protrusions 132 may be arranged from the outside to the inside, the plurality of stress grooves 131 and the plurality of stress protrusions 132 may be arranged alternately, but the embodiments are not limited thereto, and the plurality of stress grooves 131 and the plurality of stress protrusions 132 may be arranged flexibly.

It should be understood that, the stress groove 131 and the stress protrusion 132 may be distinguished by taking the surface on the side of the organic layer 13 away from the inorganic layer 12 as a base plane, the groove bottom of the stress groove 131 may be below the base plane, and the uppermost point of the stress protrusion 131 (that is, a convex roof) may be above the base plane.

In some embodiments of the present disclosure, as shown in FIG. 3 to FIG. 5, there are a plurality of stress grooves 131, and the number of the stress grooves 131 is equal to the number of the slots 122. The plurality of stress grooves 131 may be disposed corresponding to the plurality of slots 122, respectively. On the premise that the stress dispersion effect of the organic layer 13 is ensured, complicated processes due to the excessive number of stress grooves 131 is avoided, and the design of the organic layer 13 is facilitated. Of course, the plurality of stress grooves 131 and the plurality of slots 122 may not be disposed in one-to-one correspondence.

It should be understood that, when there are a plurality of stress grooves 131, the number of the stress grooves 131 and the number of the slots 122 may be different, so as to facilitate the flexible design of the OLED display panel 100.

Moreover, when the surface on the side of the organic layer 13 away from the inorganic layer 12 is provided with stress protrusions 132, the number of the stress protrusions 132 may be equal to or may be different from (as shown in FIG. 6) the number of the slots 122. When there are a plurality of stress protrusions 132, structures of the plurality of stress protrusions may be the same or may be different.

In the embodiments of the present disclosure, an orthographic projection of the non-planar structure on the base substrate 11 falls within the orthographic projection of the combination of the plurality of dams 121 and the plurality of slots 122 on the base substrate 11.

Optionally, the groove bottoms of the plurality of stress grooves 131 are respectively disposed opposite to the plurality of slots 122, that is, orthographic projections of the groove bottoms of the plurality of stress grooves 131 on the base substrate 11 fall within orthographic projections of the plurality of slots 122 on the base substrate 11, respectively, so as to further effectively reduce the impact force transmitted from the organic layer 13 to the plurality of dams 121. For example, in the examples of FIG. 3 to FIG. 5, the plurality of stress grooves 131 and the plurality of slots 122 may be disposed in one-to-one correspondence, that is, each stress groove 131 is disposed corresponding to one slot 122, and the groove bottom of each stress groove 131 is disposed opposite to a corresponding slot 122 in a thickness direction of the OLED display panel 100 (for example, up-down direction in FIG. 3 to FIG. 5), so that the groove bottoms of the plurality of stress grooves 131 and the plurality of dams 121 are in a staggered arrangement in inside-outside direction. In this way, an impact force transmitted from the organic layer 13 to the plurality of dams 121 is effectively reduced, thereby avoiding the generation of cracks on the plurality of dams 121 which could lead to the failure of the encapsulation.

It should be noted that, the groove bottoms of the plurality of stress grooves 131 and the plurality of slots 122 are disposed opposite to each other, respectively, which may include the following cases: the groove bottom of each stress groove 131 and the corresponding slot 122 are just opposite to each other, in this case, the groove bottom of each stress groove 131 is disposed opposite to a center of the corresponding slot 122 in the thickness direction of the OLED display panel 100, but is not limited to this. For example, when the groove bottoms of the plurality of stress grooves 131 and the plurality of slots 122 are disposed opposite to each other, respectively, the stress groove of each stress groove 131 may be offset from the center of the corresponding slot 122, so that the groove bottoms of the plurality of stress grooves 131 and the plurality of dams 121 are in a staggered arrangement in inside-outside direction (for example, left-right direction in FIG. 3 to FIG. 6). The groove bottom of the stress groove 131 may be construed as a position of the stress groove 131 closest to the base substrate 11.

In some optional embodiments of the present disclosure, as shown in FIG. 3 to FIG. 5, structures of the plurality of stress grooves 131 are the same, thereby facilitating the processing of the plurality of stress grooves 131, simplifying the processing procedure of the non-planar structure, and increasing the processing efficiency.

It should be understood that, the structures of the plurality of stress grooves 131 may not be totally the same, and the structure of at least one stress groove 131 of the plurality of stress grooves 131 is different from structures of other stress grooves 131, so that the design of the non-planar structure is flexible, and a diverse design of the OLED display panel 100 is realized, thus the OLED display panel 100 has a good practicability and applicability.

In some embodiments of the present disclosure, as shown in FIG. 3 to FIG. 5, the groove bottom of the stress groove 131 is higher than the upper surface of the dam 121, that is, a vertical distance between the groove bottom of each stress groove 131 and the base substrate 11 is greater than a vertical distance between a surface of the dam 121 away from the base substrate 11 and the base substrate 11, so that the stress groove 131 and the dam 121 are separated from each other in up-down direction, thereby the groove bottom of the stress groove 131 may be higher than the protruding portion 133 to ensure the buffer effect of the protruding portion 133, thereby avoiding the cracks from a further propagation and transmission.

In some specific embodiments of the present disclosure, a width of a section of the stress groove 131 decreases gradually or remains unchanged from top to bottom, that is, a width of the stress groove 131 in the radial direction (that is the left-right direction in FIG. 3 to FIG. 6) decreases gradually or remains unchanged from the groove opening to the groove bottom. With such a design, it facilitates forming the stress groove 131 from the surface on the side of the organic layer 13 away from the inorganic layer 12, thereby increasing the processing efficiency of the stress groove 131. The width of the section of the stress groove 131 may be represented by the width of the section of the stress groove 131 in the inside-outside direction (for example, left-right direction in FIG. 3 to FIG. 5), and the specific structure of the stress groove 131 may be set according to actual applications.

For example, in the example of FIG. 4, the width of the section of the stress groove 131 may decrease linearly from top to bottom; for another example, in the example of FIG. 3, the width of the section of the stress groove 131 may decrease downwardly gradually and non-linearly from top to bottom; for a further example, in the example of FIG. 5, the width of the section of the stress groove 131 may remain unchanged from top to bottom.

It should be understood that, when the surface on the side of the organic layer 13 away from the inorganic layer 12 is provided with the stress protrusions 132, a width of a section of the stress protrusion 132 may increase gradually or remain unchanged from top to bottom, but is not limited to this.

Optionally, the bottom of the stress groove 131 comprises a planar surface, a curved surface, or a combination of different planar surfaces, or a combination of a planar surface and a non-planar surface, so that the design of the stress groove 131 is diverse, which facilitates the flexible design of the OLED display panel 100.

For example, in the example of FIG. 5, the bottom of the stress groove 131 is a planar surface, which facilitates the design of the stress groove 131; for another example, in the example of FIG. 3, the bottom of the stress groove 131 is a non-planar surface, which facilitates smooth design of the bottom of the stress groove 131, and avoiding stress concentration in the stress groove 131; for a further example, in the example of FIG. 4, the bottom of the stress groove 131 is a combination of different planar surfaces, for example, the stress groove 131 may be a combination of two intersecting planar surfaces. Wherein, the non-planar surface may be curved surface, paraboloid, ellipsoid, etc.

It should be understood that, when the surface on the side of the organic layer 13 away from the inorganic layer 12 is provided with stress protrusions 132, the top surface of the stress protrusion 132 may be planar surface, or curved surface (as shown in FIG. 6), or a combination of different planar surfaces, or a combination of planar surfaces and non-planar surfaces.

As shown in FIG. 3 to FIG. 6, the slot 122 may penetrate the inorganic layer 12 in the thickness direction of the OLED display panel 100, that is, the depth of the slot 122 may be equal to the thickness of the inorganic layer 12, so that the plurality of dams 121 are disposed at intervals, thereby further avoiding the cracks generated on the outer dams 121 from propagating to adjacent dams 121, further increasing the encapsulating reliability of the OLED display panel 100. It should be understood that, the slot 122 may not penetrate the inorganic layer 12 in the thickness direction of the OLED display panel 100, that is, the depth of the slot 122 may be smaller than the thickness of the inorganic layer 12.

Optionally, in the examples of FIG. 3 to FIG. 6, the inorganic layer 12 may comprise a first inorganic layer 120a and a second inorganic layer 120b arranged in sequence, the second inorganic layer 120b is located between the first inorganic layer 120a and the base substrate 11. The depth of the slot 122 may be smaller than, equal to, or greater than the thickness of the first inorganic layer 120a.

With reference to FIG. 2 and FIG. 3 to FIG. 6, the first inorganic layer 120a may be an interlayer dielectric layer, and the second inorganic layer 120b may be a gate insulating layer. That is, the interlayer dielectric layer 120a and the gate insulating layer 120b may extend from the display region AA all the way to the non-display region NA, so that a portion thereof may form the inorganic layer of the crack dam structure 1.

With reference to FIG. 2 and FIG. 3 to FIG. 6, the organic layer of the crack dam structure 1 may be a planarization layer. That is, the planarization layer 120c may extend from the display region AA all the way to the non-display region NA, so that a portion thereof may form the organic layer of the crack dam structure 1.

The display apparatus according to some embodiments of the present disclosure may comprise the OLED display panel 100 according to the above embodiments of the present disclosure. For example, the display apparatus may comprise a housing, and the OLED display panel 100 is disposed in the housing.

In the display apparatus according to the present disclosure, by using the above OLED display panel 100, the service life of the display apparatus is ensured.

The OLED display panel 100 according to the embodiments of the present disclosure will be described below in detail in four specific embodiments with reference to FIG. 3 to FIG. 6. It should be understood that, the description below is merely illustrative, and do not limit the present disclosure.

As shown in FIG. 3, the OLED display panel 100 comprises a crack dam structure 1 on an outer edge thereof, and the crack dam structure 1 comprises an inorganic layer 12 and an organic layer 13 arranged in sequence on the base substrate 11.

For example, the buffer layer 14 is disposed on the upper surface of the base substrate 11, the inorganic layer 12 is disposed on the upper surface of the buffer layer 14, the inorganic layer 12 comprises an inorganic layer body 123, five dams 121 and five slots 122, the five dams 121 and the five slots 122 are located at the edge of the inorganic layer 12, and the five dams 121 and the five slots 122 are arranged alternately from the outside to the inside, a slot 122 is defined between two adjacent dams 121, a dam 121 is defined between two adjacent slots 122, and a slot 122 is defined between the innermost one of the five dams 121 and the inorganic layer body 123. Wherein, each dam 121 extends along the outer edge of the OLED display panel 100 (for example, extend in a direction perpendicular to the principal plane in FIG. 3) to form an elongated structure, each dam 121 may form a crack dam, and each slot 122 extends along the outer edge of the OLED display panel 100 to form an elongated structure.

The inorganic layer 12 comprises a first inorganic layer 120a and a second inorganic layer 120b stacked in sequence. The first inorganic layer 120a is an interlayer dielectric layer, the second inorganic layer 120b is a gate insulating layer, and the second inorganic layer 120b is located between the first inorganic layer 120a and the buffer layer 14. Each slot 122 penetrates the first inorganic layer 120a and the second inorganic layer 120a in the up-down direction, so that the five dams 121 are disposed at intervals. Wherein, the first inorganic layer 120a may be a silicon nitride layer, and the second inorganic layer 120b may be a silicon oxide layer.

The organic layer 13 may be disposed on the inorganic layer 12, and the organic layer 13 covers the plurality of dams 121 and a portion of the inorganic layer body 123, and fills the plurality of slots 122. The outer edges of the base substrate 11 and the buffer layer 14 are both located on the outside of the inorganic layer 12. An outer edge of the organic layer 13 is disposed on the upper surface of the buffer layer 14, and an inner edge of the organic layer 13 is disposed on the upper surface of the inorganic layer 12. The organic layer 13 is provided with five protruding portions 133, and the five protruding portions 133 fit into the five slots 122 to fill the corresponding slots 122, respectively, so each protruding portion 133 may be formed by extending a portion of a lower surface of the organic layer 13 downwardly to the buffer layer 14. Wherein, the material of the organic layer 13 may include polyimide.

The surface on the side of the organic layer 13 away from the inorganic layer 12 (for example, the upper side of FIG. 3) is provided with five stress grooves 131, so that a sawtooth structure is formed on the side of the organic layer 13 away from the inorganic layer 12. Structures of the five stress grooves 131 are the same, the width of the section of each stress groove 131 decreases non-linearly from top to bottom, and the groove bottom of each stress groove has an arc surface, so that transition between two adjacent stress grooves may be smooth. Groove bottoms of the five stress grooves are disposed opposite to the five slots 122, respectively, so that the groove bottoms of the five stress grooves and the corresponding slots 122 are in a staggered arrangement in the inside-outside direction (for example, left-right direction of FIG. 3), and the groove bottom of each stress groove 131 is higher than the upper surface of the dam 121.

The OLED display panel 100 according to the embodiments of the present disclosure has a simple structure, and is convenient for processing, and the periphery of the OLED display panel 100 may be effectively prevented from generating cracks, thereby the encapsulating reliability is increased.

As shown in FIG. 4, the structure of the embodiments is approximately the same as that in FIG. 3, wherein the same reference numerals indicate the same elements, the difference therebetween is in that the width of the section of each stress groove 131 decreases linearly from top to bottom, and the bottom of each stress groove 131 is a combination of two intersecting planar surfaces, so that the stress groove 131 is approximately a V-shaped groove.

As shown in FIG. 5, the structure of the embodiment is approximately the same as that in FIG. 3, wherein the same reference numerals indicate the same elements, the difference therebetween is in that the width of the section of each stress groove 131 remains unchanged from top to bottom, and the bottom of each stress groove 131 is a planar surface.

As shown in FIG. 6, the structure of the embodiment is approximately the same as that in FIG. 3, wherein the same reference numerals indicate the same elements, the difference therebetween is in that the surface of the organic layer 13 away from the base substrate 11 (for example, the upper surface of FIG. 6) is provided with four stress protrusions 132, so that the side of the organic layer 13 away from the inorganic layer 12 has a sawtooth structure.

In the description of this specification, the description with reference to terms "one embodiment", "some embodiments", "exemplary embodiments", "examples", "specific examples", or "some examples" or the like means that the specific features, structures, materials or characteristics described in conjunction with the embodiments or examples are included in at least one embodiment or example of the present disclosure. In this specification, the schematic representations of the above terms do not necessarily indicate the same embodiment or example. Moreover, the described specific features, structures, materials or characteristics may be combined in any one or more embodiments or examples in a suitable manner.

Although the embodiments of the present disclosure have been shown and described, those of ordinary skill in the art can understand that various changes, modifications, substitutions, and variations may be made to these embodiments without departing from the principle and purpose of the present disclosure. The scope of the present disclosure shall be defined by the claims and their equivalents.

What is claimed is:

1. An electroluminescent display panel, comprising:
   a base substrate, the base substrate comprising a display region and a non-display region arranged along a periphery of the display region;
   an encapsulating structure on the base substrate, the encapsulating structure extending from the display region to the non-display region; and
   a crack dam structure on the base substrate, the crack dam structure being located at an edge of the non-display region, and being located on a side of the encapsulating structure away from the display region, the crack dam structure comprising:
     an inorganic layer on the base substrate, the inorganic layer comprising a plurality of dams and a plurality of slots, the plurality of dams and the plurality of slots being located at an edge of a side of the inorganic layer away from the display region; and
     an organic layer, the organic layer being disposed on the inorganic layer, covering at least the plurality of dams and filling the plurality of slots,
   wherein a surface of the organic layer away from the base substrate comprises at least a non-planar structure;
   wherein the inorganic layer and the organic layer of the crack dam structure surround the display region; and
   wherein the display panel further comprises a buffer layer on the base substrate, wherein the inorganic layer is disposed on the buffer layer, and a surface of the inorganic layer facing the buffer layer is in contact with a surface of the buffer layer facing the inorganic layer; and a surface of the organic layer facing the plurality of slots is in contact with the buffer layer, and the surface of the inorganic layer that is in contact with the buffer layer is flush with the surface of the organic layer that is in contact with the buffer layer.

2. The electroluminescent display panel according to claim 1, wherein the non-planar structure comprises at least one stress groove, and each stress groove is provided with a groove opening away from the base substrate and a groove bottom close to the base substrate.

3. The electroluminescent display panel according to claim 2, wherein an orthographic projection of the non-planar structure on the base substrate falls within an orthographic projection of a combination of the plurality of dams and the plurality of slots on the base substrate.

4. The electroluminescent display panel according to claim 2, wherein there are a plurality of stress grooves, and the number of the stress grooves is equal to the number of the slots.

5. The electroluminescent display panel according to claim 4, wherein orthographic projections of groove bottoms of the plurality of stress grooves on the base substrate fall within orthographic projections of the plurality of slots on the base substrate, respectively.

6. The electroluminescent display panel according to claim 3, wherein a vertical distance between the groove bottom of each stress groove and the base substrate is greater than a vertical distance between a surface of each dam away from the base substrate and the base substrate.

7. The electroluminescent display panel according to claim 2, wherein a width of each stress groove in a radial direction decreases gradually from the groove opening towards the groove bottom, and the radial direction is a direction from a center of the display panel to an edge of the display panel.

8. The electroluminescent display panel according to claim 2, wherein the groove bottom of each stress groove comprises a planar surface, a curved surface, or a combination of a planar surface and a curved surface.

9. The electroluminescent display panel according to claim 4, wherein structures of the plurality of stress grooves are the same.

10. The electroluminescent display panel according to claim 2, wherein the non-planar structure further comprises at least one stress protrusion, and each stress protrusion comprises a convex roof away from the base substrate.

11. The electroluminescent display panel according to claim 10, wherein an orthographic projection of the convex roof of each stress protrusion on the base substrate falls within orthographic projections of the plurality of dams on the base substrate.

12. The electroluminescent display panel according to claim 10, wherein each stress groove and/or each stress protrusion extends in a peripheral direction of the display panel.

13. The electroluminescent display panel according to claim 1, wherein the plurality of dams and the plurality of slots are arranged alternately in a radial direction, and the radial direction is the direction from the center of the display panel to the edge of the display panel.

14. The electroluminescent display panel according to claim 1, wherein each slot penetrates the inorganic layer in a direction perpendicular to the base substrate.

15. The electroluminescent display panel according to claim 1, wherein the inorganic layer comprises a gate insulating layer and an interlayer dielectric layer.

16. The electroluminescent display panel according to claim 1, wherein the organic layer comprises a planarization layer.

17. A display apparatus, comprising the electroluminescent display panel according to claim 1.

18. The electroluminescent display panel according to claim 2, wherein a width of each stress groove in a radial direction remains unchanged from the groove opening towards the groove bottom, and the radial direction is a direction from a center of the display panel to an edge of the display panel.

19. The electroluminescent display panel according to claim 15, wherein the display panel further comprises a plurality of pixels in the display region, at least one of the pixels comprises a pixel driving circuit and a light emitting element connected to the pixel driving circuit, the pixel driving circuit comprises a transistor, and the transistor comprises: a semiconductor layer on the base substrate; a gate electrode overlapped with the semiconductor layer; and a source electrode and a drain electrode in contact with the semiconductor layer; and the gate insulating layer is located between the semiconductor layer and the gate electrode, and the interlayer dielectric layer is located between the gate electrode and the source electrode.

20. The electroluminescent display panel according to claim 19, wherein the display panel further comprises a planarization layer, the planarization layer being located between the source layer and the light emitting element.

* * * * *